United States Patent
Ding et al.

(10) Patent No.: US 7,283,076 B1
(45) Date of Patent: Oct. 16, 2007

(54) DIGITAL NON-INTEGER SAMPLE/HOLD IMPLEMENTED USING VIRTUAL FILTERING

(75) Inventors: Lei Ding, Austin, TX (US); John L. Melanson, Austin, TX (US); Xaiofan Fei, Austin, TX (US); Bruce Duewer, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 11/478,275

(22) Filed: Jun. 29, 2006

(51) Int. Cl.
*H03M 3/00* (2006.01)
(52) U.S. Cl. .................. 341/143; 341/155
(58) Field of Classification Search ........... 341/143, 341/144, 155, 122
See application file for complete search history.

(56) References Cited

U.S. PATENT DOCUMENTS

| | | | |
|---|---|---|---|
| 7,038,711 B2 * | 5/2006 | Albright | 348/180 |
| 7,136,430 B2 * | 11/2006 | Morris et al. | 375/316 |
| 7,167,113 B2 * | 1/2007 | Azizi | 341/61 |
| 7,176,820 B1 * | 2/2007 | Fuller et al. | 341/143 |

OTHER PUBLICATIONS

Ronald E. Crochiere and Lawrence R. Rabiner, "Interpolation and Decimation of Digital Signals—A Total Review", Proceeding of the IEEE, Mar. 1981, p. 300-331,vol. 69, No. 3.
S. Harris, G. Kamath and E. Gaalaa, "A Monolithic 24-Bit, 96kHz Sample Rate Converter with AES3 Receiver and AES3 Transmitter", presented at AES 105th Convention, San Fransico, CA, 1998.

\* cited by examiner

*Primary Examiner*—Peguy JeanPierre
(74) *Attorney, Agent, or Firm*—Davis Chin; Steven Lin; Gregory S. Thomas (57) ABSTRACT

A method and apparatus for implementing non-integer sample hold operations in a sigma-delta digital-to-analog converter system includes an interpolation filter, a polyphase filter circuit, and a modulator. The polyphase filter circuit is used to virtual upsample a digital input signal by a predetermined non-integer upsample ratio of a relatively large number. The polyphase filter circuit is formed of a long zero-order hold and a short FIR filter so that only several branches associated with the polyphase filter circuit corresponding to output samples immediately after a transition of the digital input signal is required to be calculated, thereby reducing the need to store a large number of filter coefficients and eliminating complex computations.

20 Claims, 5 Drawing Sheets

DIGITAL NON-INTEGER SAMPLE/HOLD IMPLEMENTED USING VIRTUAL FILTERING

BACKGROUND OF THE INVENTION

1. Field of the Invention

The invention relates generally to sigma-delta digital-to-analog converter systems. More particularly, it relates to a method and apparatus for implementing non-integer sample/hold operations in sigma-delta digital-to-analog converter systems, which is computationally efficient and produces effective performance with simple filters.

2. Description of the Prior Art

Over the past decade or more, the use of digital technology in the audio industry has become very widespread. This has led to the development of a number of industrial standards at which audio inputs are sampled, such as at the rates of 11.025, 22.05, or 44.1 KHz for consumer audio equipment or at the rates of 8, 16, 32 or 48 KHz for professional digital equipment. It is frequently desired to mix audio samples having different sample rates. Consequently, there has arisen the need of sample-rate conversion (SRC) systems for converting one of the audio samples to the sample rate of another audio sample for allowing mixing to be performed.

Some sample rates can be easily converted, such as when a second sample rate is an integer multiple of a first sample rate. For example, in a normal system where the modulator of a sigma-delta digital-to-analog converter (DAC) system is operated at one-half of a master clock having a frequency of 12.288 MHz, the input sample rate of 96 KHz is easily converted or upsampled by 64 in order to obtain the 6.144 MHz sample rate at the modulator. However, in the case of a system where a universal serial bus (USB) is used, the master clock has a frequency of 12 MHZ. Therefore, the input sample rate of 96 KHz cannot be easily converted or upsampled to 6 MHz since this requires multiplying by a non-integer ratio of 125/8 or 15.525. For general information and discussion of multi-rate digital signal processors as regards to systems for decimation and interpolation, reference is made to an article by Ronald E. Crochiere and Lawrence R. Rabiner, "*Interpolation and Decimation of Digital Signals—A Total Review*", Proceeding of the IEEE, Vol. 69, No. 3, March 1981, p. 300-331.

Figure 1:
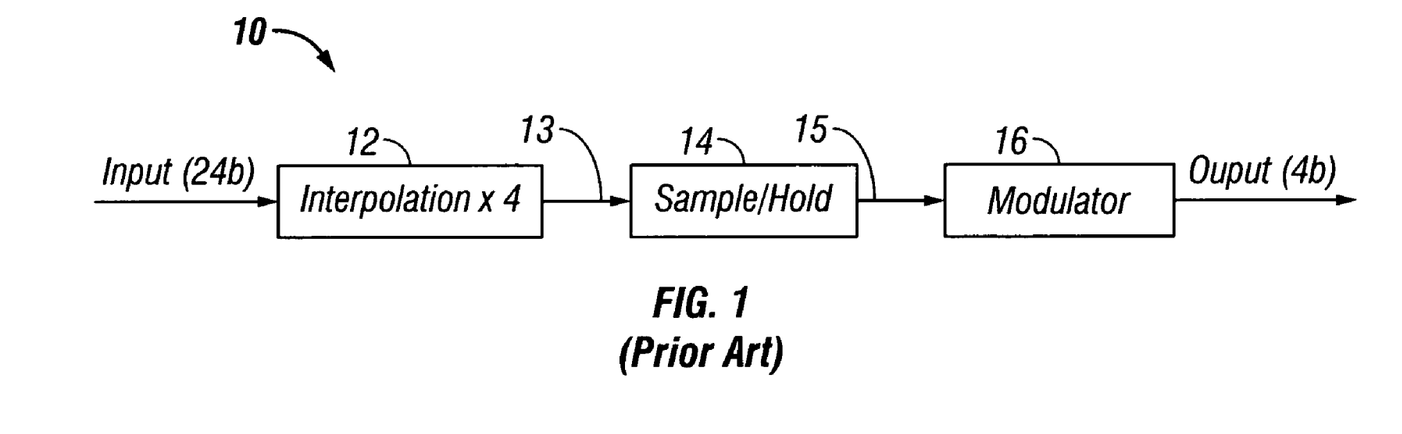
FIG. 1 is a block diagram of a front-end portion of a conventional sigma-delta digital-to-analog converter system, which has been labeled "Prior Art"

For discussion purposes, as is illustrated in FIG. 1, the front-end portion of a conventional sigma-delta digital-to-analog converter system 10 includes an interpolation filter 12 that increases the sampling rate of a digital input signal (i.e., a low-rate 24-bit input signal) by a predetermined upsampling ratio (i.e., 4) to a high sampling rate and that has a good anti-aliasing performance so as to reject images that occur at approximately the Nyquist rate of the input signal. The higher rate digital signal is then transmitted to a sample/hold block 14 having an output that is fed to a high-rate sigma-delta modulator 16 which shapes quantization noise out of the input signal band and reduces the sample to a 4-bit output signal.

In this particular configuration, the interpolation filter 12 effectively pushes aliases of the input signal to around $4-f_s$ and beyond so that a substantial amount of the noise power is translated to frequency bands well above the signal band of interest. The sample/hold block 14 is used to upsample the output of the interpolation filter to the rate at which the modulator operates and provide additional attenuation to the aliases. The amounts of attenuation required on the aliases at around and above $4-f_s$ are relatively low due to the high pass filtering of the quantization noise in the sigma-delta modulator 16.

As can be seen, with an input sample rate of 96 KHz for a 12 MHz master clock frequency and after the upsample of 4 by the interpolation filter, there is required a non-integer sample/hold ratio of 125/8 or 15.625 in order to obtain a 6 MHZ sampling rate at the modulator. Heretofore, there have been provided a number of traditional digital filter architectures used for interpolation and decimation in which the ratios are integers. However, there are presented problems with computational complexity and efficient implementation with the traditional architectures when the ratios are non-integers.

It would therefore be desirable to provide a new and novel filtering approach which can be used to implement non-integer sample/hold operations without requiring a high number of computations to be performed and thus can be realized by relatively simple filters. It would also be expedient to provide a polyphase filter in which only a few output samples immediately after an input transition is required to be calculated so as to provide computational efficiency.

SUMMARY OF THE INVENTION

Accordingly, it is a general object of the present invention to provide a novel method and apparatus for implementing non-integer sample/hold operations in a sigma-delta digital-to-analog converter which overcomes all of the disadvantages of the prior art.

It is an object of the present invention to provide a method and apparatus for implementing non-integer sample/hold operations without requiring a high number of computations to be performed and thus can be realized by relatively simple filters.

It is another object of the present invention to provide a method and apparatus for implementing a polyphase filter in which only a few output samples immediately after an input transition is required to be calculated so as to produce computational efficiency.

It is still another object of the present invention to provide a polyphase filter which is constructed in the virtual upsampled domain using a long zero-order hold and short FIR filter and implemented in the input sample domain.

In a preferred embodiment of the present invention, there is provided a sigma-delta digital-to-analog converter system for performing a non-integer sample rate conversion which includes an interpolation filter, a polyphase filter circuit, and a modulator. The interpolation filter has an input to receive a digital input signal with a first sampling rate and generates a digital output signal with a second sampling rate on its output. The second sampling rate is increased by a predetermined upsampling integer. The polyphase filter circuit is coupled to the output of the interpolation filter and is used to upsample the digital output signal with the second sampling rate by a predetermined non-integer upsample ratio of a relatively large number so as to produce a third sampling rate.

The modulator is coupled to receive the digital output signal with the third sampling rate from the polyphase filter circuit and generates a digital signal having the third sampling rate with the non-integer upsampling rate such that quantization noise is moved substantially beyond the band of the digital input signal. The polyphase filter circuit is formed of a long zero-order hold and a short FIR filter so that only several branches associated with the polyphase filter circuit corresponding to output samples immediately after a transition of the digital input signal is required to be calculated. As a result, the need to store a large number of filter coefficients has been reduced and complex computations has been eliminated.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein.

DESCRIPTION OF THE PREFERRED EMBODIMENTS

It is to be distinctly understood at the outset that the present invention shown in the drawings and described in detail in conjunction with the preferred embodiments is not intended to serve as a limitation upon the scope or teachings thereof, but is to be considered merely as an exemplification of the principles of the present invention.

Figure 2:
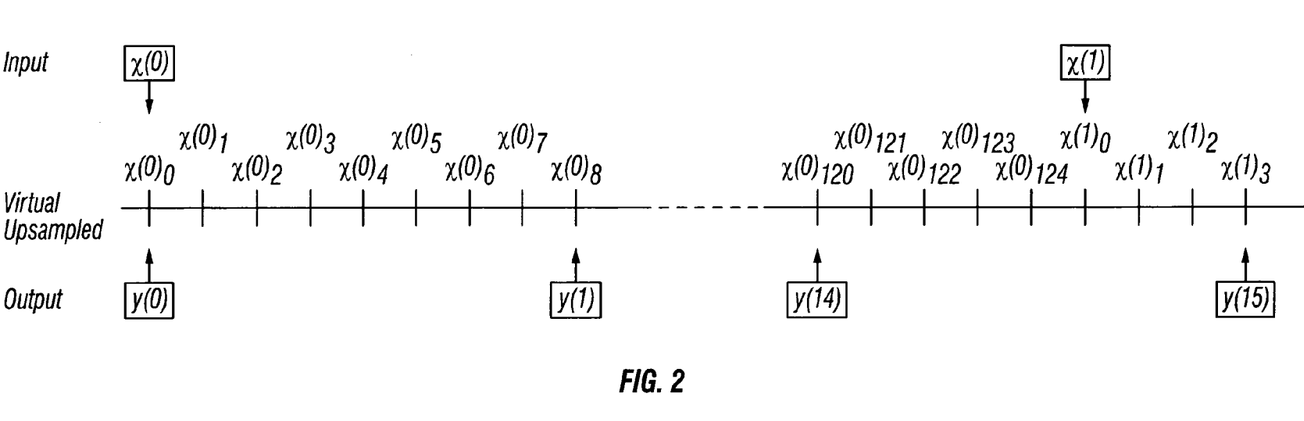
FIG. 2 is a timing diagram which illustrates the relationship of the input samples, output samples and virtual-upsampled samples.

Before describing in detail the present invention, it is believed that it would be helpful as a background to examine the relationship in time among the input samples, output samples, and virtual-upsampled samples illustrated in FIG. 2 for a selected sample/hold ratio of 125/8. In this case, the virtual-upsampled sample domain is defined herein to be the domain in which the input samples are upsampled by 125 using a zero-order hold. The term "virtual" refers to the fact that a physical upsampling is not actually implemented, but the domain is used merely as a conceptual tool for performing an analysis. Thus, in the virtual-upsampled sample domain, each input sample ($x(0), x(1)...$) is held 125 times and the output samples ($y(0), y(1)...$) are sent out every 8 virtual input samples ($x(0)_0, x(0)_1 ... x(0)_8$) in order to obtain the non-integer sample/hold ratio of 15.625.

If no filter is used in the virtual-upsampled domain, then the outputs on line 15 from the sample/hold block 14 are simply the input samples which are each held 15 or 16 times.

Figure 3:
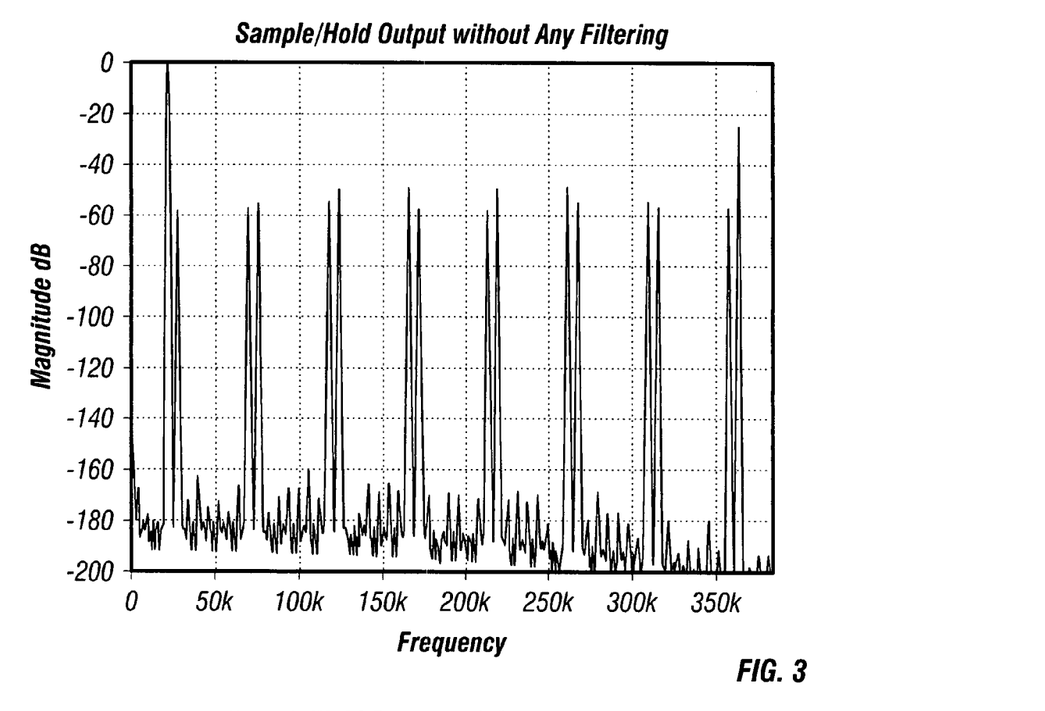
FIG. 3 is a plot of the frequency spectrum of the output of the sample/hold block 14 of FIG. 1 without any filtering.

Thus, the average of the number of times in which each input sample is being held should be equal to 125/8 or 15.625. Assume that the input on line 13 to the sample/hold block 14 is a 21 KHz signal sampled at the rate of 384 KHz (e.g., an original input sampling rate of 96 KHz which has been upsampled by 4 with the interpolator 12). For this case, the amplitude/frequency spectrum of the output from the sample/hold block 14 without any filtering is illustrated in FIG. 3.

It can been seen that since no filter is used when the decimation is performed, aliases of the input signal will fold-back into the signal band (e.g., 0-48 KHz). The attenuation on the aliases is caused by the zero-order hold operation that was performed on the input samples in the virtual upsampled domain. If the virtual upsampling was achieved by expanding the input samples by inserting zeros between the input samples, then full-scale aliases would have appeared.

Figure 4:
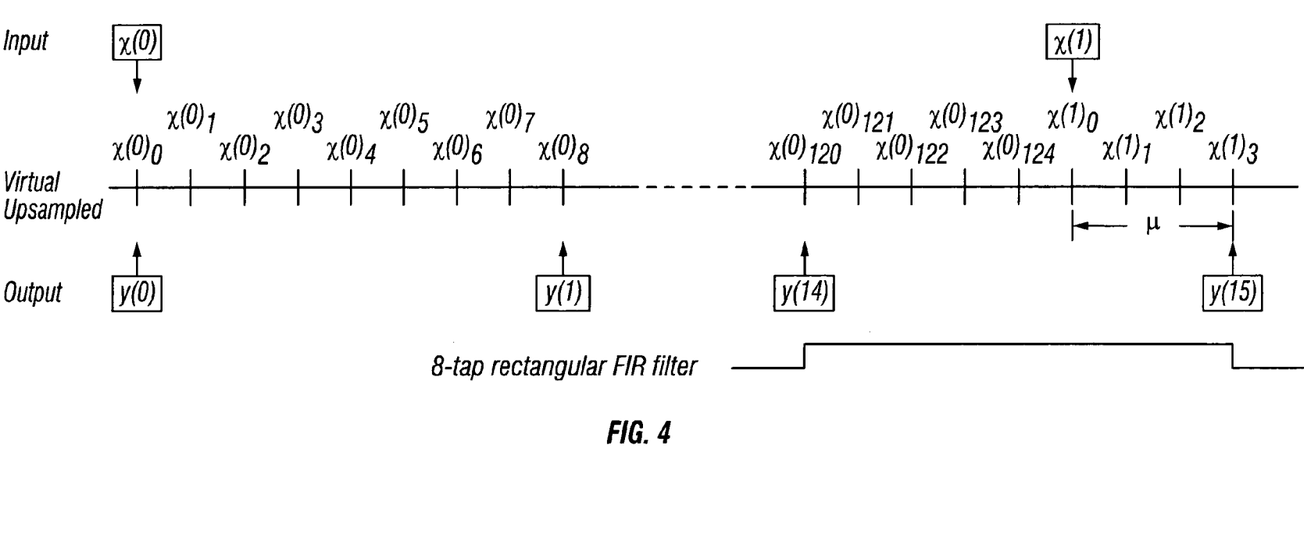
FIG. 4 is a timing diagram which illustrates the relationship of the input samples, output samples and virtual-upsampled samples for the sample/hold block 14 of FIG. 1 with a 8-tap rectangular FIR filter.

However, it should be noted that the attenuation of the aliases after decimation can be increased by utilizing filters in the virtual upsampled domain. The most effective way is to use filters with zeros around the frequency band that folds back to the signal band. FIG. 4 shows the relationship in time among the input samples, output samples, and virtual-upsampled samples with a 8-tap rectangular finite impulse filter (FIR) filter. For a decimation by 8, this FIR filter has been selected because it has zeros at the exact location that folds back to the signal band. It will be observed that in FIG. 4 the input sample ($x(0)$) to this FIR filter remains the same for a relatively long time. Therefore, the output samples ($y(1)-y(14)$) are all the same since the input samples do not change for these output samples.

However, when the output sample $y(15)$ is calculated the input sample has changed from $x(0)$ to $x(1)$. For the 8-tap rectangular FIR filter, this filter will see five input samples of $x(0)$ and three input samples of $x(1)$. Therefore, the output sample can be expressed mathematically as follows:

$$Y(15)=5/8\ x(0)+3/8\ x(1) \tag{1}$$

where a divide by 8 is used to achieve a unity gain for the FIR filter.

Figure 5:
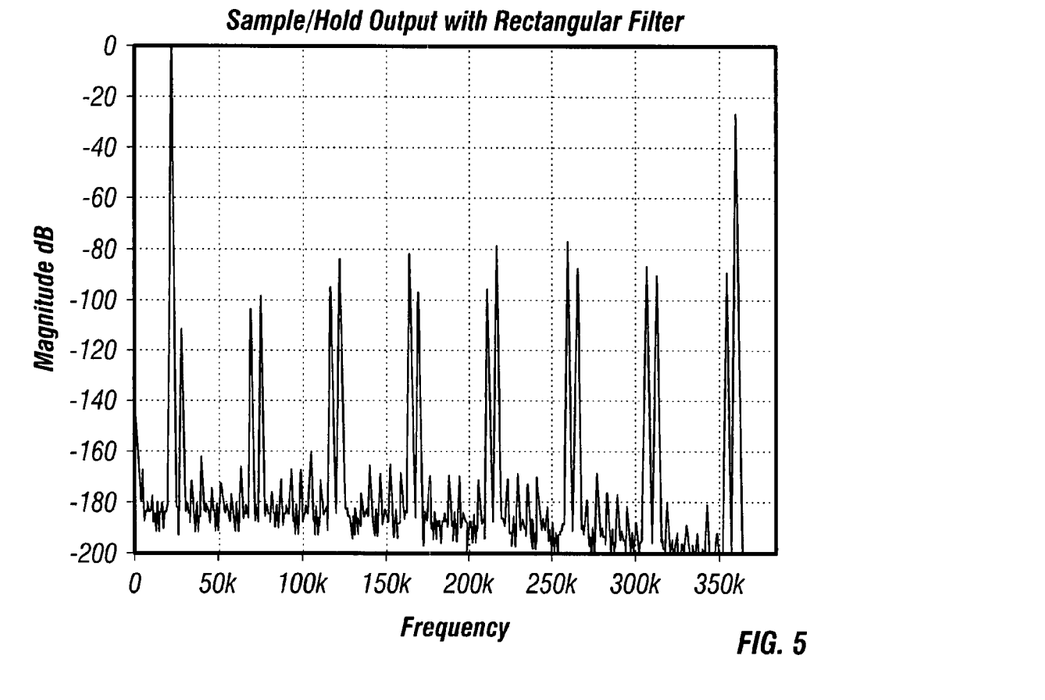
FIG. 5 is a plot of the frequency spectrum of the output of the sample/hold block 14 of FIG. 1 with a 8-tap rectangular FIR filter.

The coefficients storage and the number of computations for each output sample for the 8-tap FIR filter can be significantly simplified since it is not necessary to physically upsample and filter the upsampled data. This simplification is due to the fact that, for most of the times, the output sample is equal to the input sample. Accordingly, only the output sample immediately after a transition in the input sample is required to be calculated, thereby reducing drastically the coefficients storage required and eliminating complex computations. The amplitude/frequency spectrum of the output from the sample/hold block 14 with the 8-tap rectangular virtual filtering is illustrated in FIG. 5.

For a general sample/hold block having a ratio of L/M, where L is the up-sampling factor and M is the down-sampling factor, the sample/hold block can be implemented by using a simple M-tap FIR filter. When the input sample changes between two consecutive output samples, the immediate output sample after the change of the input sample is calculated by the general expression as follows:

$$Y(m)=(1-\mu/M)x(n-1)+\mu/M\ x(n) \tag{2}$$

where $\mu$ is the number of samples between $x(n)_0$ and $y(m)$ in the virtual upsampled domain.

Figure 6:
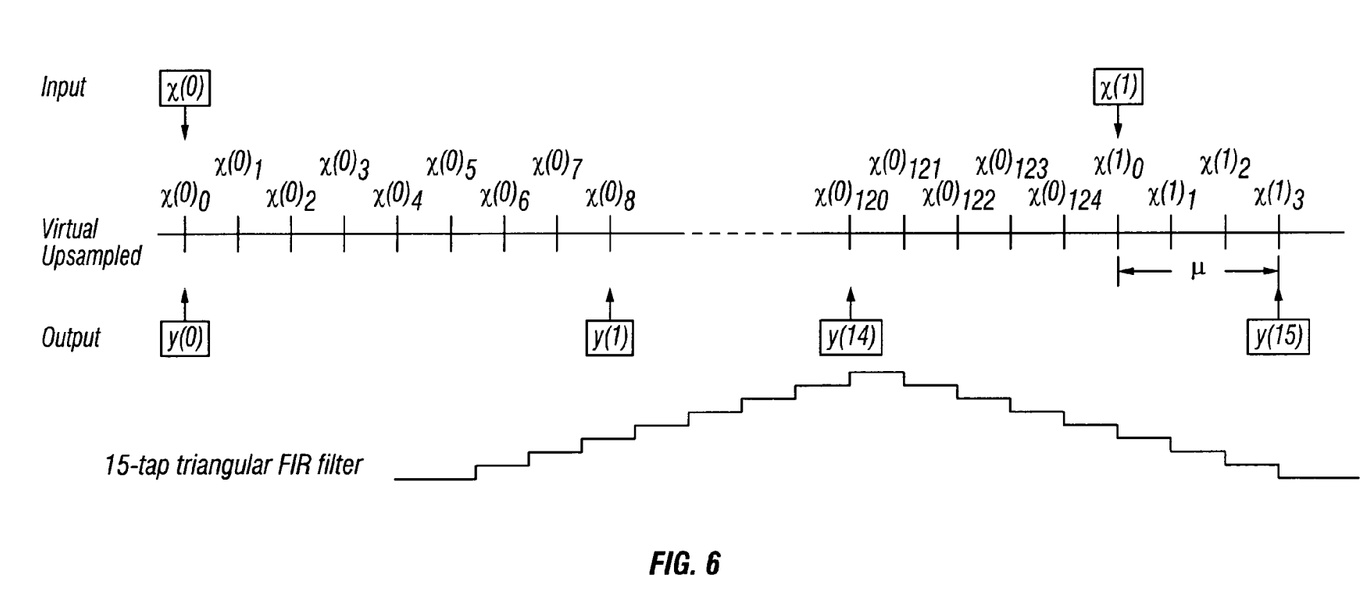
FIG. 6 is a timing diagram similar to FIG. 4, but is illustrated for the sample/hold block 14 of FIG. 1 with a 15-tap triangular FIR filter.

In order to achieve greater attenuation to the aliases, two 8-tap rectangular FIR filters can be convoluted so as to generate a 15-tap triangular filter. Since the triangular FIR filter has two zeros at each location in the frequency spectrum that folds back to the signal band, there will be provided a larger attenuation to the aliases. FIG. 6 shows the relationship in time among the input samples, output samples, and virtual-upsampled samples with a 15-tap triangular finite impulse filter (FIR) filter.

Since this triangular filter is longer, the two output samples immediately after a transition of the input sample are required to be calculated. The other output samples do not need to be computed since they are equal to the input samples. Specifically, for the input samples and output samples shown in FIG. 6, it can be seen that the output samples y(2)-y(14) are still equal to the input sample x(0). The output samples y(15) and y(16) are determined by the expressions as follows:

$$y(15)=58/64x(0)+6/64x(1) \quad (3)$$

$$y(16)=10/64x(0)+54/64x(1) \quad (4)$$

Figure 7:
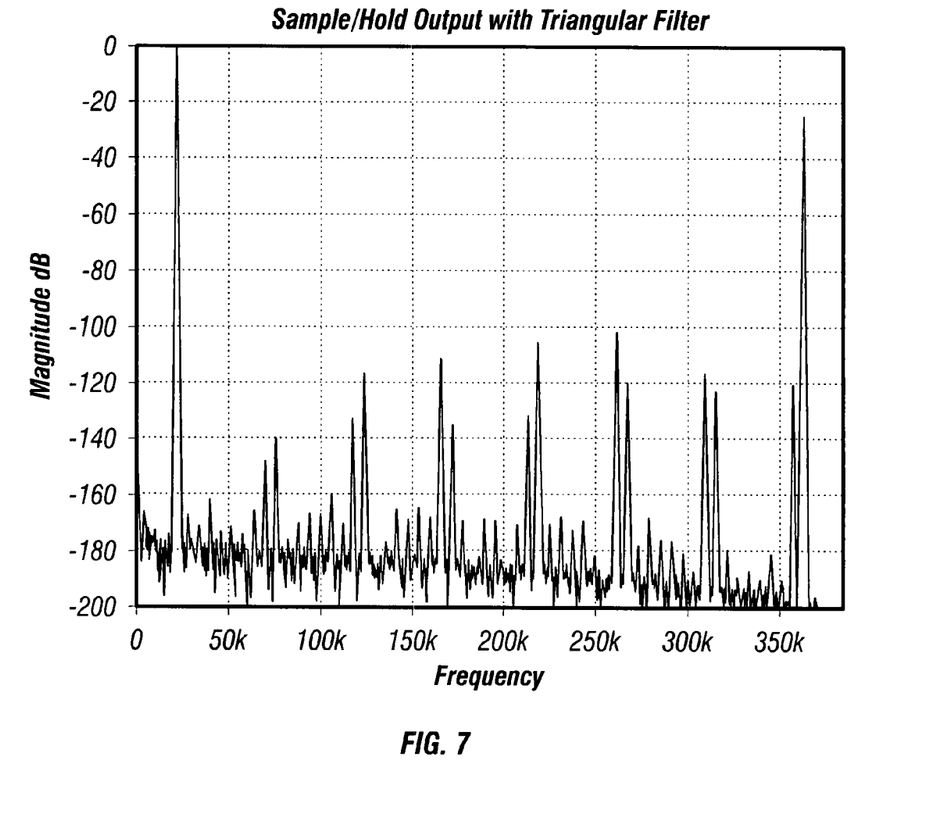
FIG. 7 is a plot of the frequency spectrum of the output of the sample/hold block 14 of FIG. 1 with a 15-tap triangular FIR filter.

The amplitude/frequency spectrum of the output from the sample/hold block 14 with the 15-tap triangular virtual filtering is illustrated in FIG. 7. Again, for a general sample/hold block having a ratio of L/M, where L is the up-sampling factor and M is the down-sampling factor, the sample/hold block can be implemented by using a triangular FIR filter with 2M−1 taps. When the input sample changes between two consecutive output samples, the two output samples immediately after the change of the input sample are calculated by the general expressions as follows;

$$y(m)=[[1-\mu(\mu+1)]/2M^2]x(n-1)+[[\mu(\mu+1)]/2M^2x(n) \quad (5)$$

$$y(m+1)=[1-M+1/2-\mu/M+\mu(\mu+1)/2M^2]x(n-1)$$
$$+[M+1/2+\mu/M-\mu(\mu+1)/2M^2]x(n) \quad (6)$$

where μ is again the number of samples between $x(n)_0$ and y(m) in the virtual upsampled domain.

Figure 8:
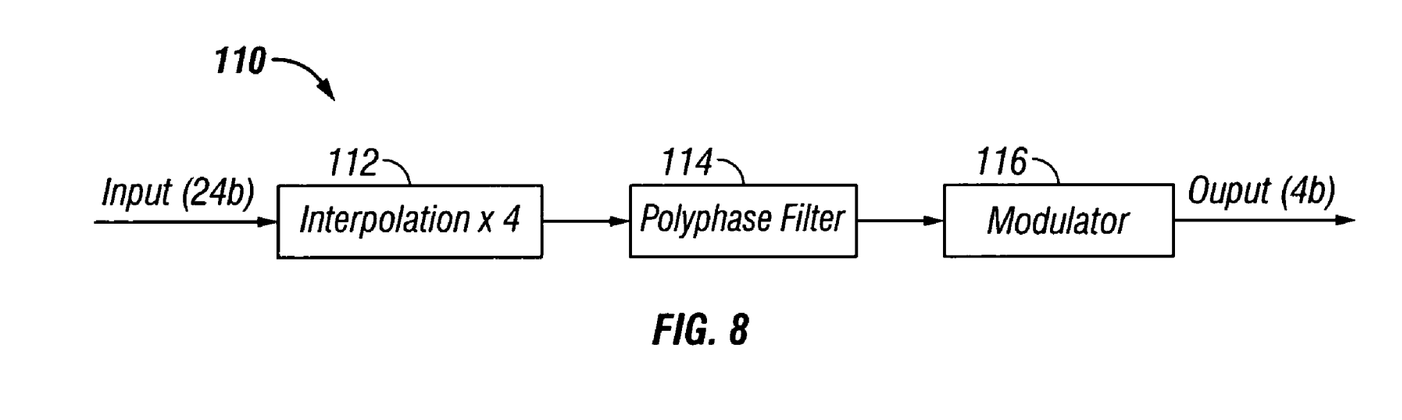
FIG. 8 is a block diagram of a front-end of a sigma-delta digital-to-analog converter system, constructed in accordance with the principles of the present invention.

In FIG. 8, there is shown a front-end portion of a sigma-delta digital-to-analog converter system 110, constructed in accordance with the principles of the present invention and utilizing a unique polyphase filter for implementing non-integer sample/hold operations. In particular, the converter system 110 comprises an interpolation filter 112, a polyphase filter 114, and a sigma-delta modulator 116. The interpolation filter 112 increases the sampling rate of a digital input signal (i.e., a low-rate 24-bit input signal) by a predetermined upsampling ratio (i.e., 4) to a high sampling rate and that has a good anti-aliasing performance so as to reject images that occur at approximately the Nyquist rate of the input signal. The higher rate digital signal is then transmitted to the polyphase filter 114 having an output that is fed to the high-rate sigma-delta modulator 116 which shapes quantization noise out of the input signal band and reduces the sample to a 4-bit output signal.

The polyphase filter 114 is constructed in one embodiment as an 8-tap rectangular FIR filter and 125-tap zero-order hold of FIG. 4. In a second embodiment, the polyphase filter 114 is constructed as a 15-tap triangular FIR filter and 125-tap zero-order hold of FIG. 6. However, unlike the prior art polyphase filters, the polyphase filter 114 of the present invention does not require the storing of a number of tap coefficients or weights corresponding to the number of input samples for most of the associated branches.

Since the input changes slowly (the input samples remain the same for a long time) the output samples do not change for these inputs. Therefore, since most of the branches in the present polyphase filter 114 are equal to the input samples, they can be bypassed to the output so as to reduce drastically the coefficients storage required and eliminate complex computations. Consequently, for the 8-tap FIR filter, only the output sample immediately after a transition in the input sample needs to be calculated. Equation (2) is shown above for implementing the polyphase filter 114 using the M-tap rectangular FIR filter so as to calculate the immediate output sample after the change in the input sample. In addition, the equations (5) and (6) shown above for implementing the polyphase filter 114 is used for the 2M−1 tap triangular FIR filter so as to calculate the two immediate output samples after the change in the input sample.

Figure 9:
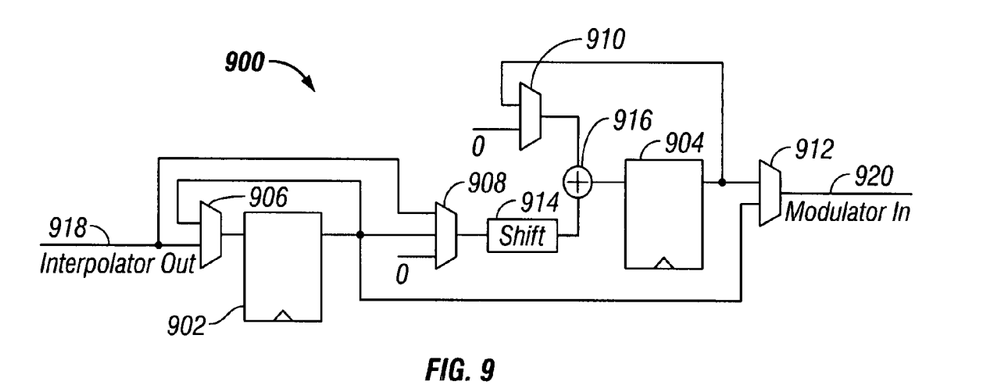
FIG. 9 is a schematic diagram of a FIR filter circuit of the present invention for implementing the polyphase filter of FIG. 8.

FIG. 9 is a circuit implementation of the M-tap rectangular FIR filter for producing the result of equation (2). The FIR filter circuit 900 includes a first flip-flop 902, a second flip-flop 904, four multiplexers 906-912, a shift register 914, and summer 916 all interconnected together in a manner as shown. The input on line 918 to the FIR filter is from the output of the interpolation filter 112 (FIG. 8), which has been upsampled to 4−$f_s$. The output on line 920 of the filter is fed to the input of sigma-delta modulator 116 (FIG. 8).

The operation of the filter circuit 900 will now be discussed for a sample/hold ratio of L/M, where L is equal to the upsampling factor of 125 and M is equal to the down-sampling factor of 8 in connection with FIG. 4. Initially, the input samples x(0) on line 918 for each cycle are sent through the multiplexer 906 and are stored on the output of the first flip-flop 902. For providing the output samples y(1) through y(14), the input samples x(0) from the flip-flop 902 are sent through or bypassed to the multiplexer 912 to the output on the line 920.

In order to provide the output sample y(15), the input sample x(0) from the interpolation filter 112 during the first cycle under the control of control logic circuitry (not shown) is sent through the multiplexer 908 to the shift register 914. The control logic circuitry causes the input sample x(0) being a power of two to be shifted to the right by 3, which is equivalent to a divide by 8. Thus, the output of the shift register 914 being x(0)/8 is passed through the summer 916 and into the second flip-flop 904 functioning as an accumulator so as to store x(0)/8 on its output.

During the second cycle, the next input sample x(0) is again sent through the multiplexer 908 and into the shift register 914. The summer 916 combines x(0)/8 from the shift register with x(0)/8 from the multiplexer 910 and is inputted to the second flip-flop 904. The output of this second flip-flop will now be storing 2/8 x(0). This process is repeated for three more cycles so as to cause the output of the flip-flop 904 to store 5/8 x(0).

Next, the input sample being changed to x(1) from the interpolation filter 112 during the sixth cycle is sent through the multiplexer 908 to the shift register 914. The control logic circuitry causes the input sample x(1) being a power of two to be shifted to the right by 3, which is equivalent to a divide by 8. Thus, the output of the shift register 914 being x(1)/8 is passed through the summer 916 and into the second flip-flop 904 functioning as an accumulator so as to store x(1)/8 on its output.

During the seventh cycle, the next input sample x(1) is again sent through the multiplexer 908 and into the shift register 914. The summer 916 combines x(1)/8 from the shift register with x(1)/8 from the multiplexer 910 and is inputted to the second flip-flop 904. The output of this second flip-flop will now be storing 2/8 x(1). This process is repeated for one more cycle so as to cause the output of the flip-flop 904 to store 3/8 x(1). After the output of the second flip-flop 904 has stored 5/8 x(0)+3/8 x(1) corresponding to equation (2) for generating y(15), it will be sent out through the multiplexer 912.

From the foregoing detailed description, it can thus be seen that the present invention provides a method and apparatus for implementing non-integer sample hold operations in a sigma-delta digital-to-analog converter system which includes an interpolation filter, a polyphase filter circuit, and a modulator. Only several branches associated with the polyphase filter circuit corresponding to output samples immediately after a transition of the digital input signal is required to be calculated so as to reduce the need to store a large number of coefficients and to eliminate complex computations.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

The invention claimed is:

1. A sigma-delta digital-to-analog converter system for performing a non-integer sample rate conversion, comprising:
   an interpolation filter having an input to receive a digital input signal with a first sampling rate and to generate a digital output signal with a second sampling rate on its output, said second sampling rate being increased by a predetermined upsampling integer;
   a polyphase filter circuit coupled to the output of said interpolation filter and being used to upsample the digital output signal with the second sampling rate by a predetermined non-integer upsample ratio of a relatively large number so as to produce a third sampling rate;
   a modulator coupled to receive the digital output signal with the third sampling rate from said polyphase filter circuit and to generate a digital signal having the third sampling rate with the non-integer upsampling rate such that quantization noise is moved substantially beyond the band of the digital input signal; and
   said polyphase filter circuit being formed of a long zero-order hold and a short FIR filter so that only several branches associated with said polyphase filter circuit corresponding to output samples immediately after a transition of the digital input signal is required to be calculated.

2. A sigma-delta digital-to-analog converter system as claimed in claim 1, wherein the non-integer upsampling ratio of said polyphase filter circuit is L/M, where L is the upsampling factor and M is the downsampling factor and wherein said short FIR filter is a M-tap FIR filter.

3. A sigma-delta digital-to-analog converter system as claimed in claim 2, wherein said M-tap FIR filter is a 8-tap rectangular FIR filter.

4. A sigma-delta digital-to-analog converter system as claimed in claim 3, wherein when the digital input signal changes between two consecutive output samples, the immediate output sample after the change of the digital input sample is given by $$Y(m)=(1-\mu/M)x(n-1)+\mu/Mx(n)$$

where $\mu$ is the number of samples between $x(n)_0$ and $y(n)$ in the virtual upsampled domain.

5. A sigma-delta digital-to-analog converter system as claimed in claim 2, wherein said M-tap FIR filter is a 15-tap triangular FIR filter.

6. A sigma-delta digital-to-analog converter system as claimed in claim 5, wherein when the digital input signal changes between two consecutive output samples, the two output samples following the change of the digital input sample are given by $$y(m)=[1-\mu(\mu+1)/2M^2]x(n-1)+\mu(\mu+1)/2M^2x(n) \text{ and}$$

$$y(m+1)=[1-M+1/2-\mu/M+\mu(\mu+1)/2M^2]x(n-1)$$

$$+[M+1/2+\mu/M-\mu(\mu+1)/2M^2]x(n)$$

where u is the number of samples between $x(n)_0$ and $y(m)$ in the virtual upsampled domain.

7. An interpolation filter for performing a non-integer sample rate conversion, said interpolation filter comprising:
   a polyphase filter circuit being used to upsample a digital input signal with a first sampling rate by a predetermined non-integer upsample ratio of a relatively large number so as to produce a second sampling rate; and
   said polyphase filter circuit being formed of a long zero-order hold and a short FIR filter so that only several branches associated with said polyphase filter circuit corresponding to output samples immediately after a transition of the digital input signal is required to be calculated.

8. An interpolation filter as claimed in claim 7, wherein the non-integer upsampling ratio of said polyphase filter circuit is L/M, where L is the upsampling factor and M is the downsampling factor and wherein said short FIR filter is a M-tap FIR filter.

9. An interpolation filter as claimed in claim 8, wherein said M-tap FIR filter is a 8-tap rectangular FIR filter.

10. An interpolation filter as claimed in claim 9, wherein when the digital input signal changes between two consecutive output samples, the immediate output sample after the change of the digital input sample is given by $$y(m)=(1-\mu/M)x(n-1)+\mu/Mx(n)$$

where $\mu$ is the number of samples between $x(n)_0$ and $y(m)$ in the virtual upsampled domain.

11. An interpolation filter as claimed in claim 8, wherein said M-tap FIR filter is a 15-tap triangular FIR filter.

12. An interpolation filter as claimed in claim 11, wherein when the digital input signal changes between two consecutive output samples, the two output samples following the change of the digital input sample are given by $$y(m)=[1-\mu(\mu+1)/2M^2]x(n-1)+\mu(\mu+1)/2M^2x(n) \text{ and}$$

$$y(m+1)=[1-M+1/2-\mu/M+\mu(\mu+1)/2M^2]x(n-1)$$

$$+[M+1/2+\mu/M-\mu(\mu+1)/2M^2]x(n)$$

where $\mu$ is the number of samples between $x(n)_0$ and $y(m)$ in the virtual upsampled domain.

13. A method for performing a non-integer sample rate conversion in a sigma-delta digital-to-analog converter system, comprising:

receiving a digital input signal with a first sampling rate on an input of an interpolation filter and generating a digital output signal with a second sampling rate on the output thereof, the second sampling rate being increased by a predetermined upsampling integer;

upsampling the digital output signal with the second sampling rate through a polyphase filter circuit coupled to the output of the interpolation filter by a predetermined non-integer upsample ratio of a relatively large number so as to produce a third sampling rate;

receiving the digital output signal with the third sampling rate from the polyphase filter circuit on an input of a modulator and generating a digital signal having the third sampling rate with the non-integer upsampling rate such that quantization noise is moved substantially beyond the band of the digital input signal; and calculating only several branches associated with the polyphase filter circuit corresponding to output samples immediately after a transition of the digital input signal so as to reduce the need to store a large number of filter coefficients and to eliminate complex computations.

14. A method for performing a non-integer sample rate conversion as claimed in claim 13, wherein the upsampling by the predetermined non-integer upsample ratio is L/M, where L is the upsampling factor and M is the downsampling factor.

15. A method for performing a non-integer sample rate conversion as claimed in claim 13, wherein said polyphase filter is formed of long zero-hold and a short FIR filter.

16. A method for performing a non-integer sample rate conversion as claimed in claim 15, wherein said short FIR filter is a M-tap FIR filter.

17. A method for performing a non-integer sample rate conversion comprising:

upsampling a digital input signal with a first sampling rate through a polyphase filter circuit by a predetermined non-integer upsample ratio of a relatively large number so as to produce a second sampling rate; and calculating only several branches associated with said polyphase filter circuit corresponding to output samples immediately after a transition of the digital input signal so as to reduce the need to store a large number of filter coefficients and to eliminate complex computations.

18. A method for performing a non-integer sample rate conversion as claimed in claim 17, wherein the upsampling by the predetermined non-integer upsample ratio is L/M, where L is the upsampling factor and M is the downsampling factor.

19. A method for performing a non-integer sample rate conversion as claimed in claim 17, wherein said polyphase filter is formed of long zero-hold and a short FIR filter.

20. A method for performing a non-integer sample rate conversion as claimed in claim 19, wherein said short FIR filter is a M-tap FIR filter.

* * * * *

UNITED STATES PATENT AND TRADEMARK OFFICE
CERTIFICATE OF CORRECTION

| | |
|---|---|
| PATENT NO. | : 7,283,076 B1 |
| APPLICATION NO. | : 11/478275 |
| DATED | : October 16, 2007 |
| INVENTOR(S) | : Lei Ding et al. |

It is certified that error appears in the above-identified patent and that said Letters Patent is hereby corrected as shown below:

Title page, Item (75), Inventors: change "Xaiofan" to -- Xiaofan --.

Column 8, line 6, change "y(n)" to -- y(m) --.

Signed and Sealed this

Eighteenth Day of March, 2008

JON W. DUDAS
*Director of the United States Patent and Trademark Office*